(12) United States Patent
Laletin

(10) Patent No.: US 6,411,098 B1
(45) Date of Patent: Jun. 25, 2002

(54) ENERGY DEVICE ANALYSIS AND EVALUATION

(76) Inventor: William H. Laletin, 651 Whitney Dr., Slidell, LA (US) 70461

( * ) Notice: Subject to any disclaimer, the term of this patent is extended or adjusted under 35 U.S.C. 154(b) by 0 days.

(21) Appl. No.: 09/155,308

(22) PCT Filed: Mar. 27, 1997

(86) PCT No.: PCT/US97/05002

§ 371 (c)(1),
(2), (4) Date: Dec. 8, 1998

(87) PCT Pub. No.: WO97/36182

PCT Pub. Date: Oct. 2, 1997

Related U.S. Application Data

(60) Provisional application No. 60/014,159, filed on Mar. 27, 1996.

(51) Int. Cl.[7] .............................................. H01M 10/44
(52) U.S. Cl. ........................ 324/436; 324/426; 320/161
(58) Field of Search ................................ 324/426, 713, 324/72.5, 436; 320/161

(56) References Cited

U.S. PATENT DOCUMENTS

| | | | | |
|---|---|---|---|---|
| 4,433,294 A | * | 2/1984 | Windebank | 324/426 |
| 4,825,170 A | * | 4/1989 | Champlin | 324/436 |
| 4,881,038 A | * | 11/1989 | Champlin | 324/426 |
| 5,047,971 A | * | 9/1991 | Horwitz | 364/578 |
| 5,214,385 A | * | 5/1993 | Gabriel et al. | 324/434 |
| 5,315,253 A | * | 5/1994 | Alexandres et al. | 324/429 |
| 5,572,136 A | * | 11/1996 | Champlin | 324/426 |
| 5,574,355 A | * | 11/1996 | MsShane et al. | 320/39 |
| 5,619,417 A | * | 4/1997 | Kendall | 364/483 |
| 5,757,192 A | * | 5/1998 | MsShane et al. | 324/427 |

* cited by examiner

Primary Examiner—Safet Metjahic
Assistant Examiner—Vincent Q. Nguyen

(57) ABSTRACT

A method and apparatus for creating, measuring and analyzing polarization voltages developed across an element, such as an electronic component or an electrochemical energy cell, or network of such elements, in response to a current mode excitation provided by a driver composed of a voltage controlled voltage source connected to one terminal of a Device Under Test and a voltage controlled current source connected to the other terminal of a Device Under Test. A voltage sensor, also connected across the Device Under Test, determines the magnitude and polarity of any potential appearing across the DUT; whenever the excitation current is exactly zero, this measured potential will be equal to the Open Circuit Potential of the DUT. This configuration of driver and sensor is known as a Kelvin connection. In response to the sensor's output, an internal control circuit adjusts the magnitude and polarity of an offset controlling signal provided to the voltage controlled voltage source, such that any intrinsic open circuit potential exhibited by the device under test appears centered with respect to the common ground potential of the apparatus. The offset controlling signal is also applied to the inputs of the sensor preamplifier such that the only the polarization voltage component of the DUT's voltage response to the excitation current appears at the output of the preamplifier. The characteristics of the resulting polarization voltage signal appearing at the output of the sensor preamplifier may be analyzed to yield both qualitative and quantitative information about the Device Under Test.

10 Claims, 13 Drawing Sheets

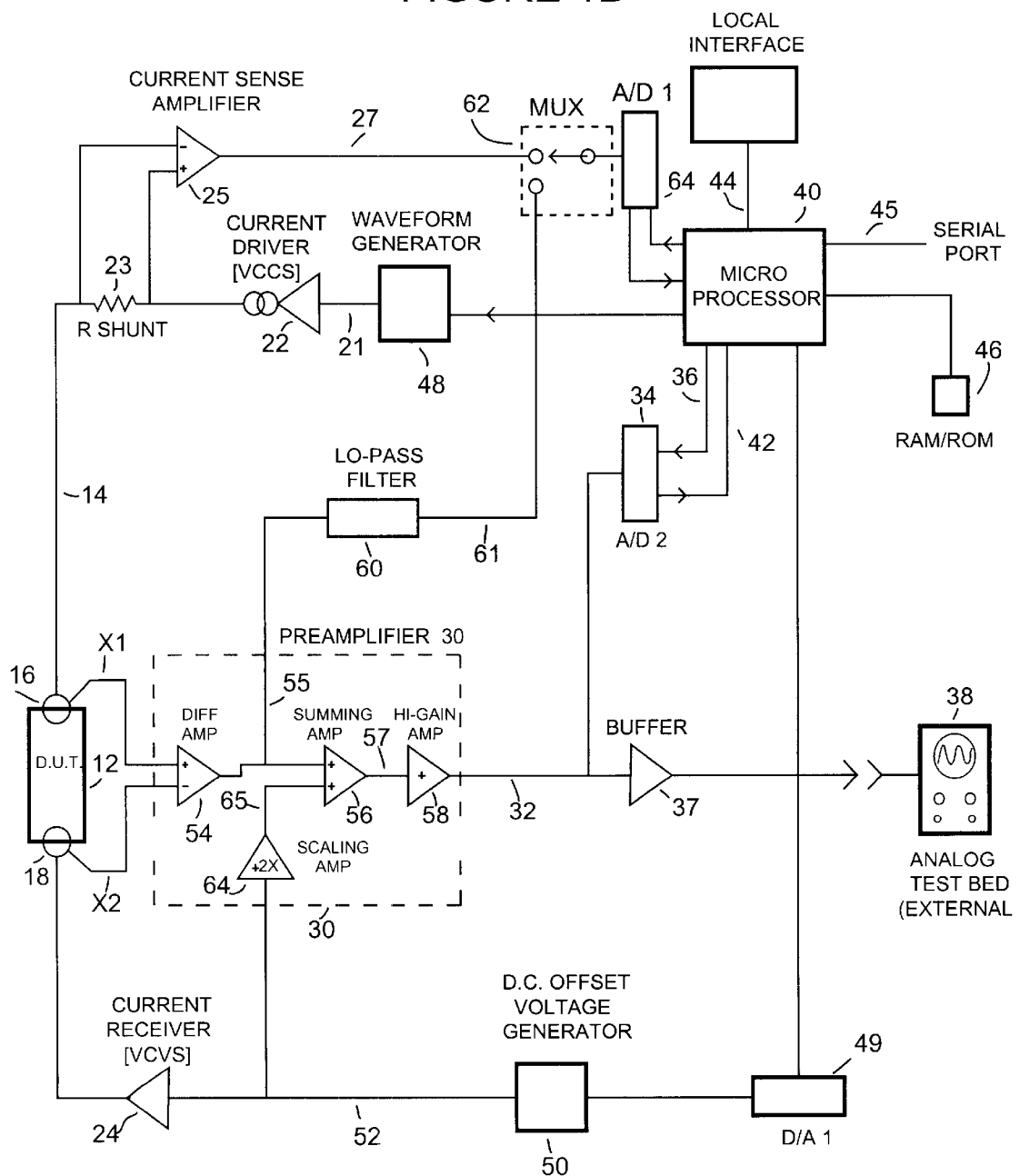

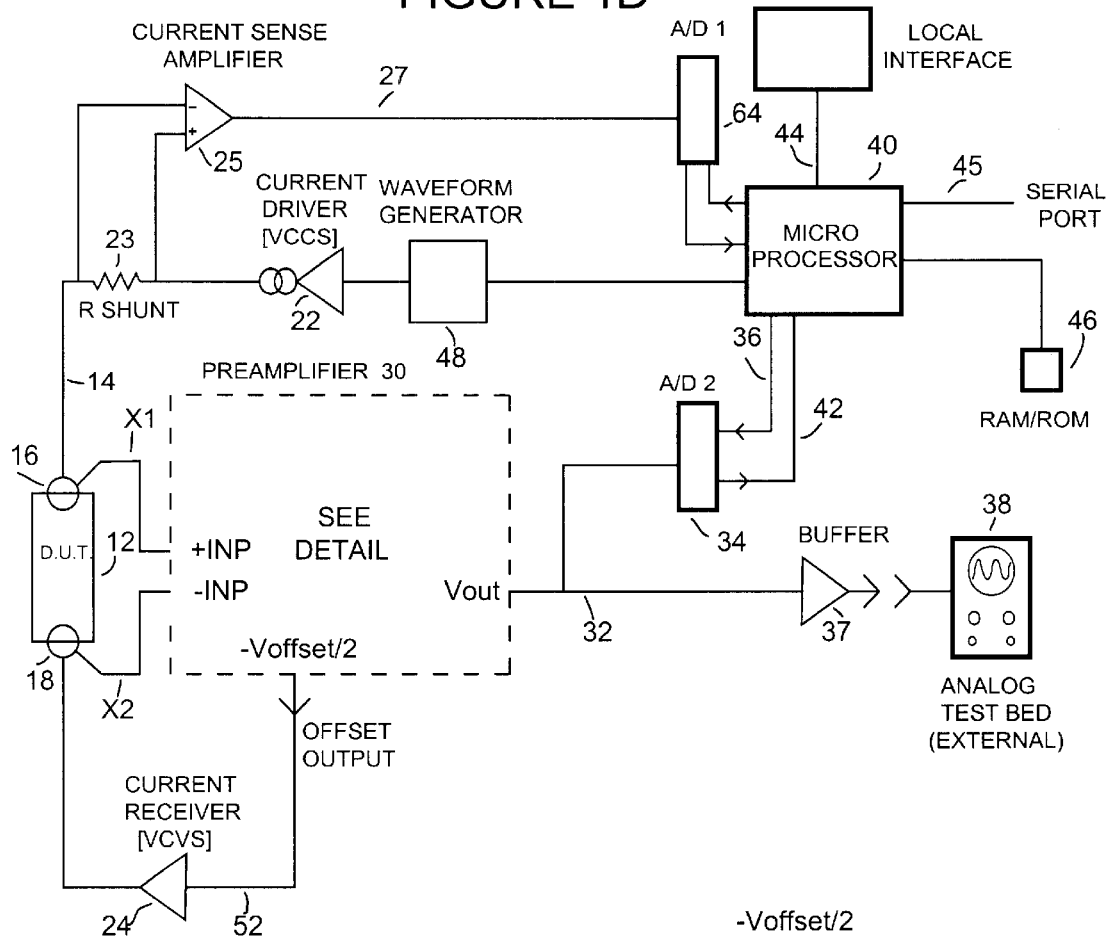
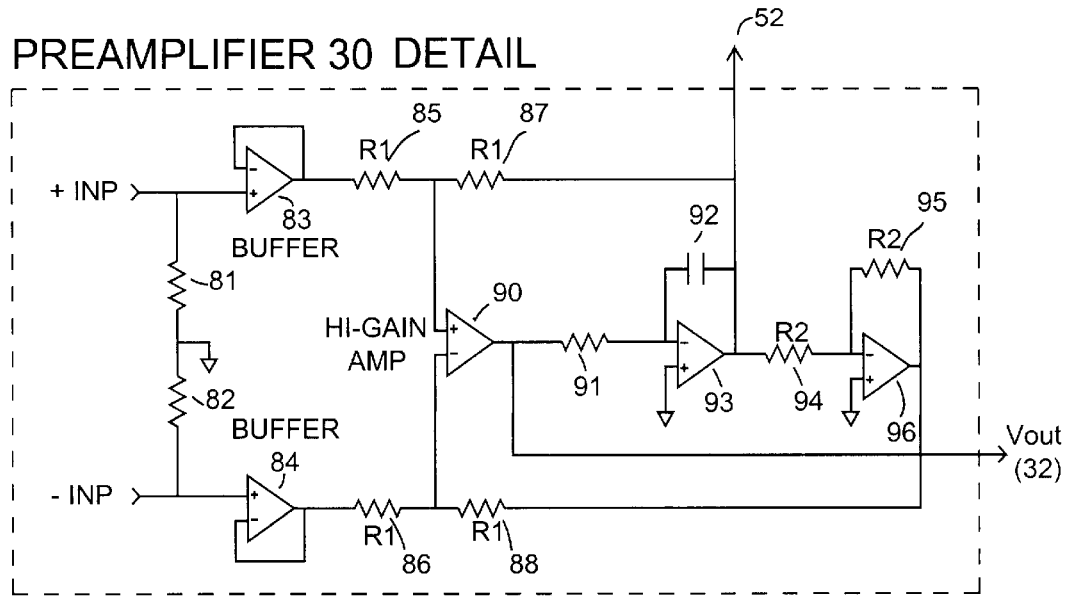

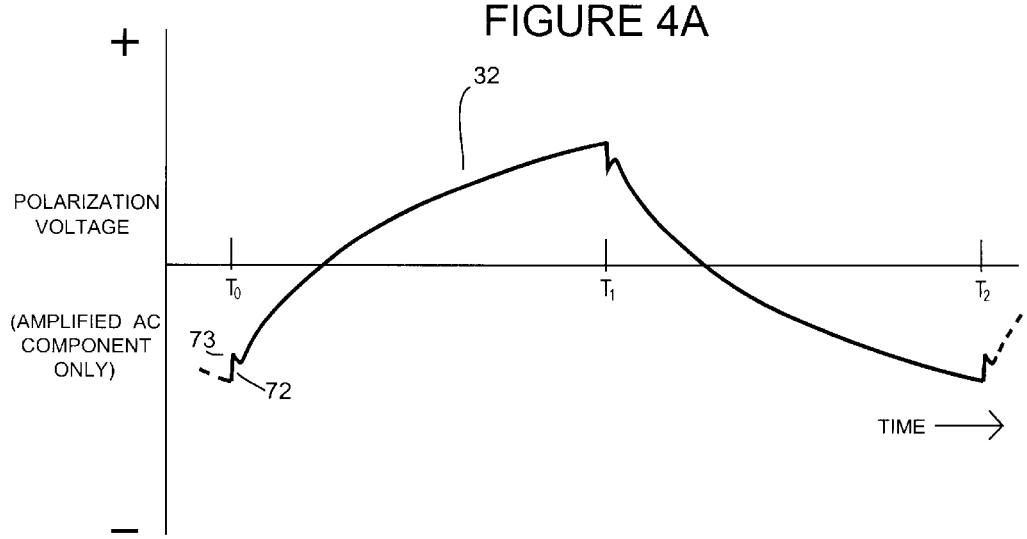
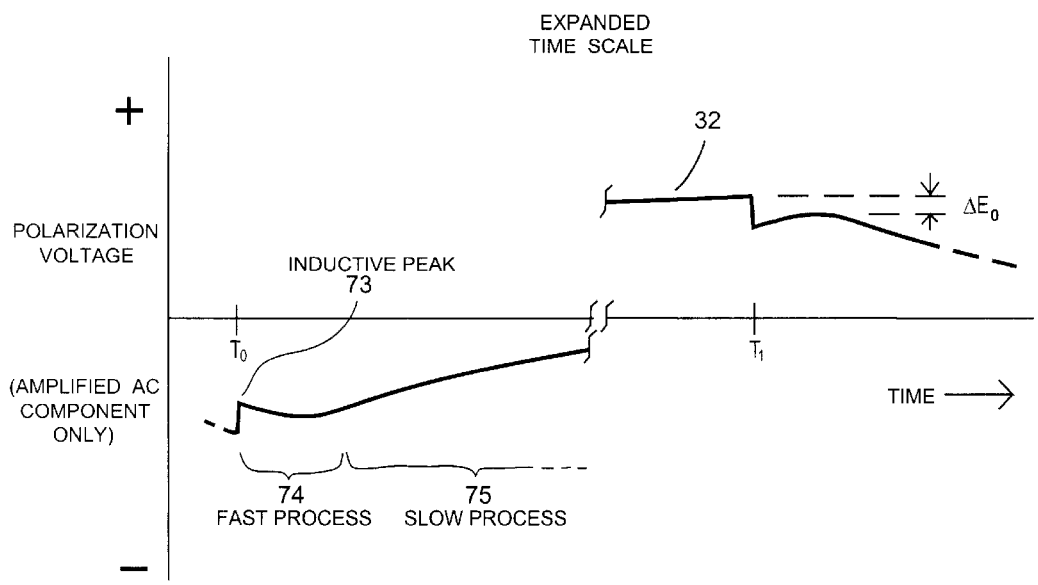

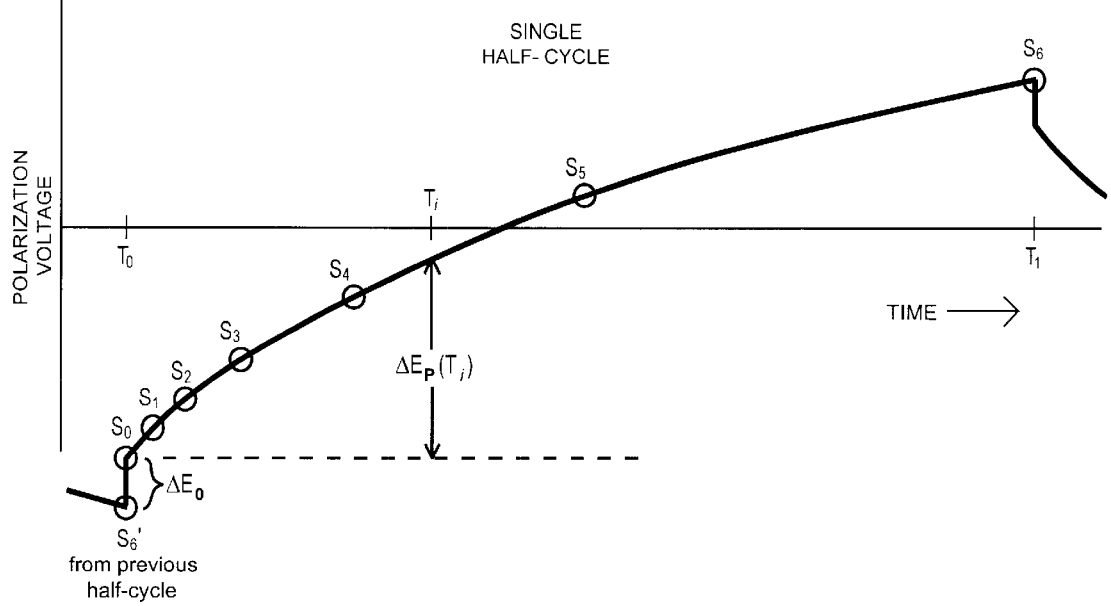
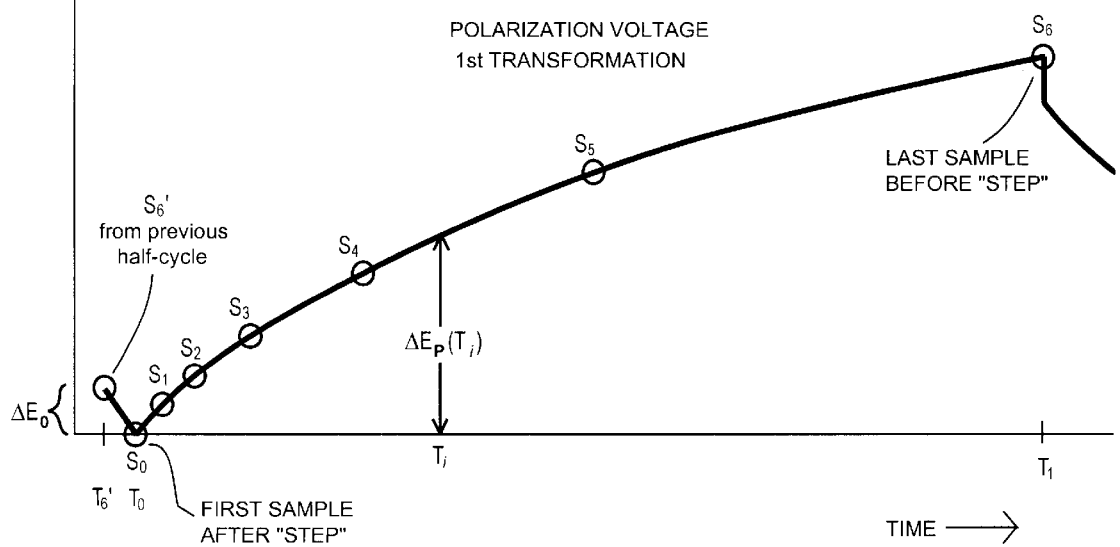

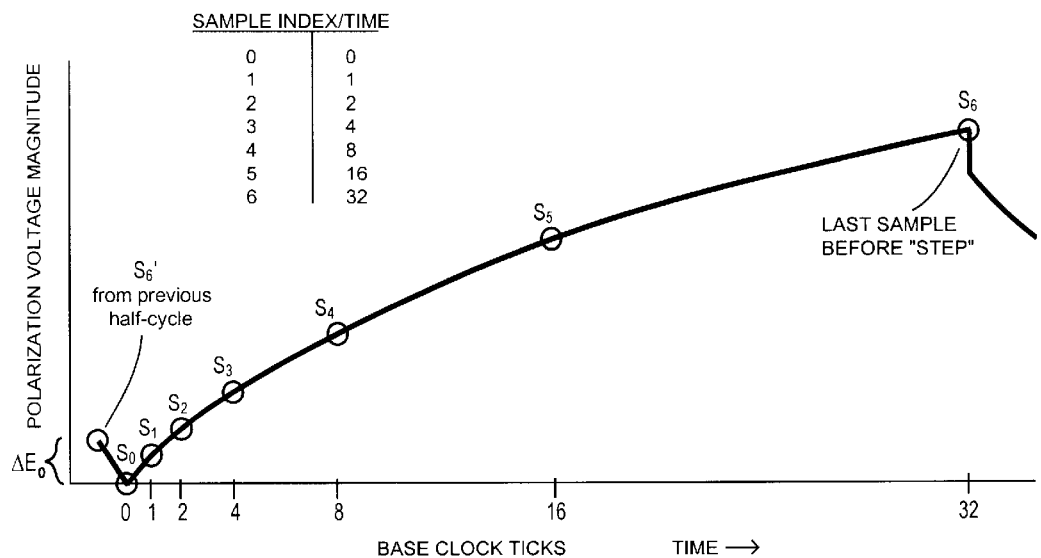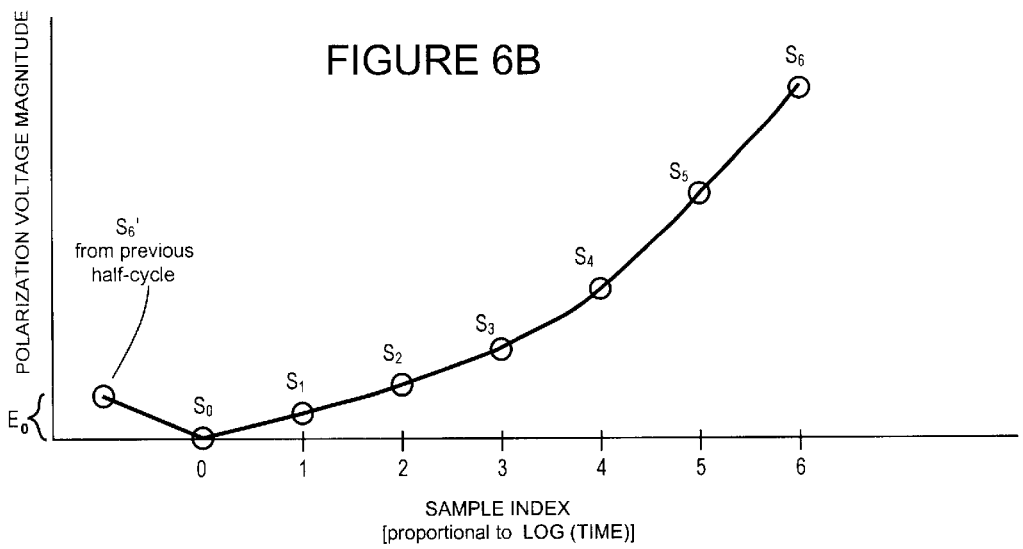

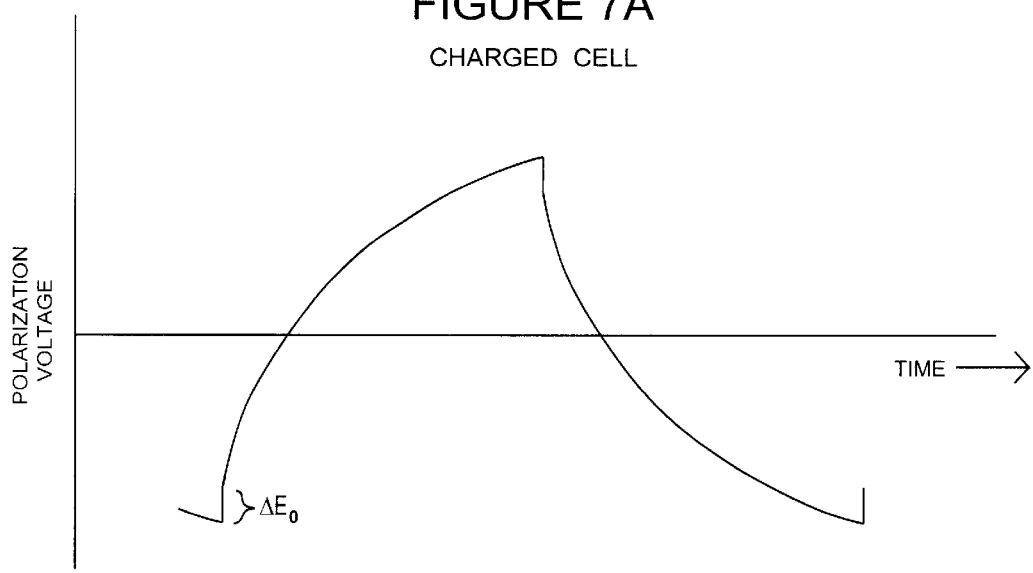
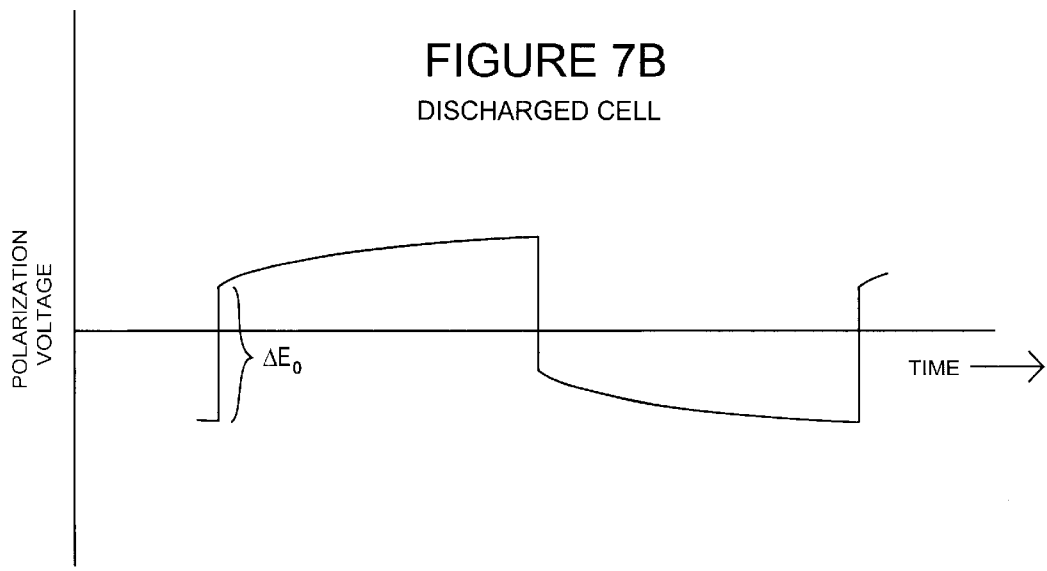

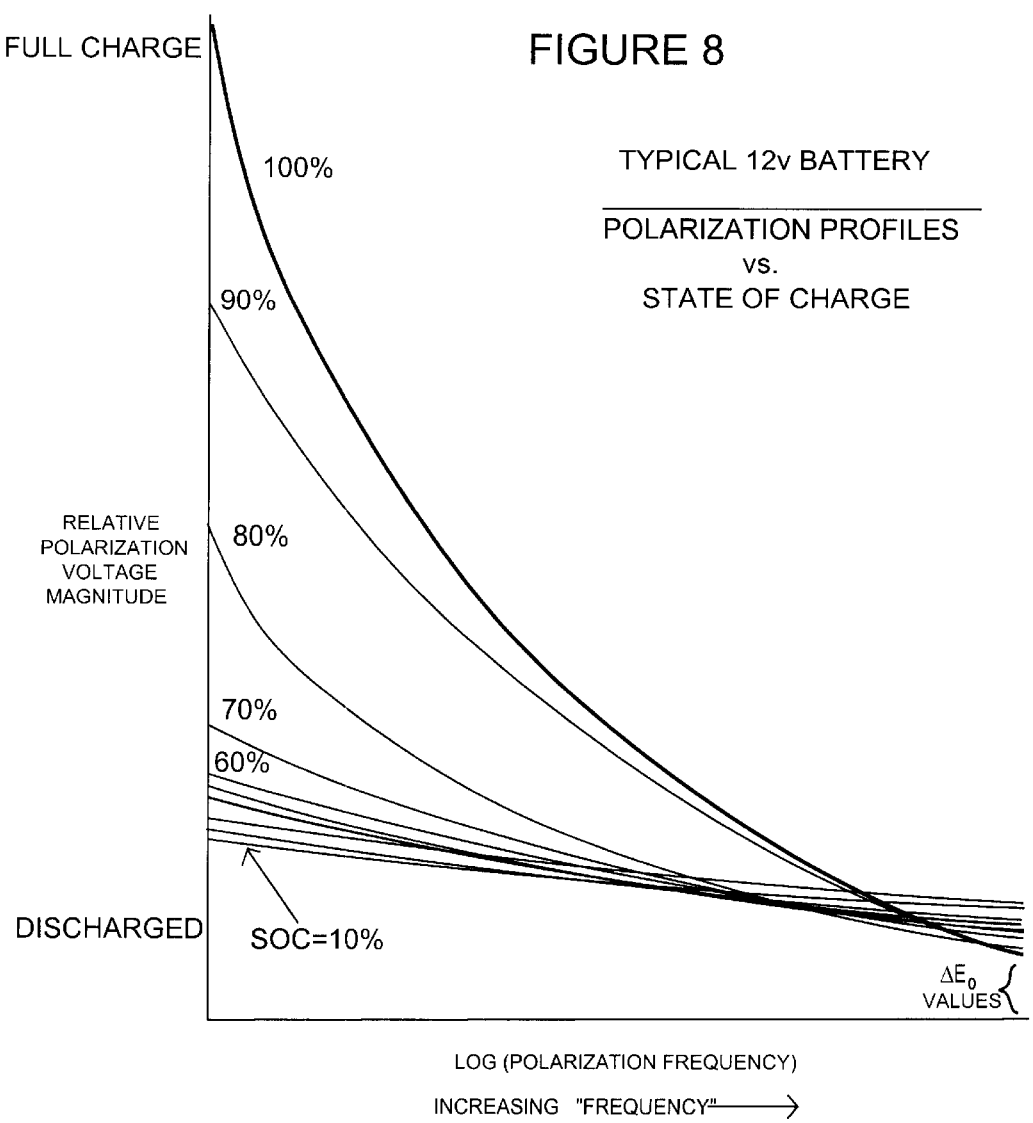

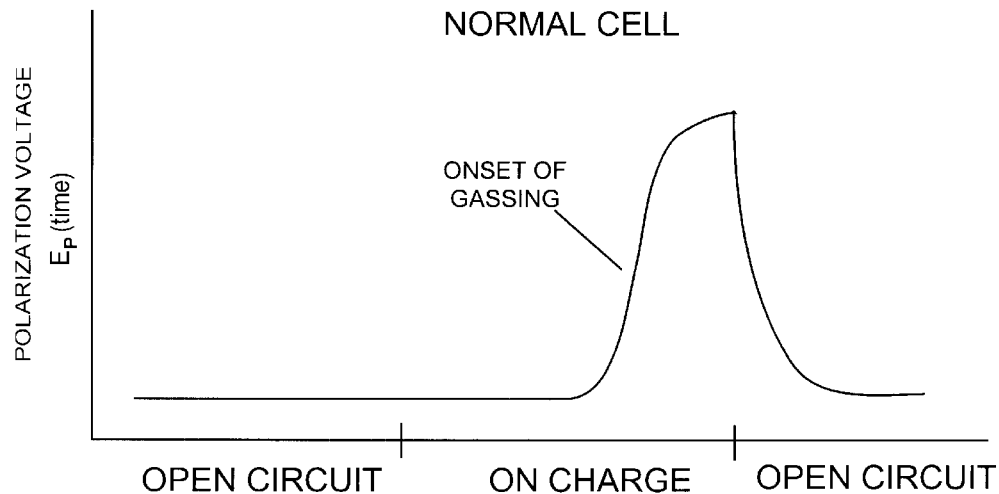
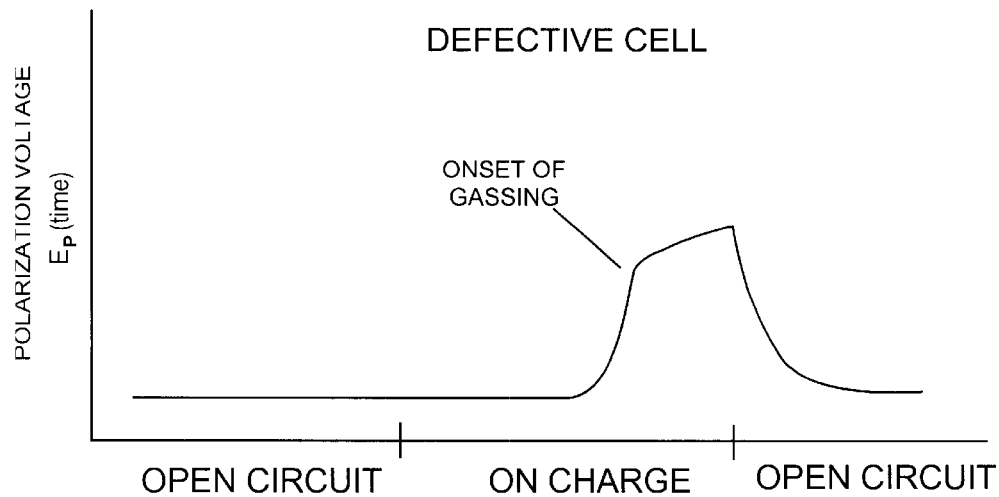

ENERGY DEVICE ANALYSIS AND EVALUATION

This application claims benefit of provisional application No. 60/014,159 filed Mar. 27, 1996.

BACKGROUND OF THE INVENTION

The invention relates to energy device testing and evaluation.

A widely used technique for investigating the behavior of energy devices such as electrochemical cells or batteries is electrochemical impedance spectroscopy, also commonly known as frequency response analysis. See MacDonald, "Impedance Spectroscopy", Wiley 1987. In general, the technique employs sinusoidal electric stimulation (AC voltage or current of known amplitude, frequency, and phase) of a device under test. Measuring the resultant in-phase and quadrature components of the device's response allows calculation of the real and imaginary components of the device impedance using Ohm's law (E=I*R or R=E/I). By taking a series of measurements over a range of frequencies, the characteristic response of the device under test is obtained. From the impedance parameters, other quantities, such as, for example, phase angle and modulus, may be derived.

Quantitative analysis is regularly achieved by using non-linear least squares fitting to adjust parameters of a proposed theoretical model or electronic circuit analog. A well chosen model will correspond to the underlying chemical and kinetic processes. Frequency response analysis is very robust, but requires performance of multiple individual tests to obtain a complete frequency response profile. As such, the duration of the test process, especially if high resolution, low frequency response information is required, may be considerable. In addition, the time domain response of the device under test must be derived from a postulated equivalent circuit model, which means that accuracy of the derived response is strongly dependent on the validity of the model and the accuracy of the raw data.

To overcome these concerns, a number of direct time domain measurement techniques have been proposed. Commonly used techniques include voltammetry, polarography, chronoamperometry and chronopotentiometry, among others. The distinguishing characteristic of these time domain methods is that, instead of using a continuous sinusoid as the excitation signal, they use continuous (usually linear or exponentially shaped) segments separated by discontinuities. Typical stimuli include, for example: triangle or square waves; a rectangular pulse or pulse train followed by return to a pre-stimulus condition; a composite signal such as a stepped potential staircase with a smaller signal superimposed on each step; or, finally, a series of alternating charge/discharge events.

For general laboratory applications where theoretical analysis of reaction mechanisms is desired, time domain data may be analyzed using well known mathematical techniques, such as Fourier and Laplace integral transforms. The Fourier method allows derivation of a cell's frequency response, while the Laplace method yields impedance and admittance information. When specifically applied to electrochemical accumulators (energy storage cells and batteries), time domain techniques may be used to assess cell condition and infer a relative state of charge.

SUMMARY

The invention provides a highly accurate technique for measuring and analyzing electric potential changes occurring in a device such as an electric or electrochemical cell as a result of stimulation with a square wave current. An electric cell here is distinguished from an electrochemical cell in that voltage potential changes occurring in the electric cell are indicative primarily of charge storage and energy loss effects due to dielectric behavior (e.g., lossy capacitor), whereas potential changes observed in an electrochemical cell reflect additional processes including physical changes (mass transport, diffusion) and various Faradaic electrochemical reactions.

The technique uses a progressive change of the polarization voltage across a device, which develops over time in response to galvanic stimulation, as an estimator of device condition. Furthermore, suitable quantitative analyses of such changes in polarization, expressed as a joint function of stimulation magnitude, polarity and duration, allow quantitative characterization of various underlying chemical processes, identification of anomalous (fault) conditions, and estimation of state of charge.

The technique may be used to electronically measure devices that exhibit reversible or quasi-reversible reactions in response to a sufficiently small excitation signal symmetrically applied about the instantaneous equilibrium potential. While not all electrochemical systems have this property, a significant number of commercial applications require the precise measurement and characterization of just such devices. The technique can be used to evaluate the time domain response of any system which exhibits the property of electrical impedance.

The invention promises to help meet an ever growing need for reliable electrochemical devices that can deliver electricity on demand, and in many cases, be quickly and easily recharged for further use. Such devices include fuel cells, primary (single use) cells and batteries, and secondary (rechargeable) cells and batteries. There is a commensurate need for a technique for rapidly evaluating the state of charge and overall condition of such a device, regardless of whether the device is static (disconnected) or dynamically operating (charging/discharging).

The ability to rapidly perform a quantitative test of device condition is particularly important when the device is being used to supply power to a critical load, so that an unexpected failure may have serious consequences. Similarly, qualification testing during and immediately after batteries or other electrochemical cells are produced, the charge process would bring new economies to battery manufacturing. The same technique may be used in the field to perform tests prior to and after sale. Finally, the technique may be used in the laboratory to provide immediate information on electrochemical cell behavior under controlled conditions to support evolving battery technologies.

Polarization voltage is operationally defined in this document as the difference between the cell potential just prior to the onset of a step-wise change in current stimulation (i.e., the leading edge of a pulse or square wave) and the value attained at some specific later time during the stimulation. By employing high speed synchronous sampling methods, the actual waveform of the polarization voltage that develops during each half-period of the square wave excitation may be recorded for later analysis.

Specifically, a bipolar square wave current exhibiting a 50% duty cycle (mark-space ratio=1) and an average DC current component of exactly zero is used to stimulate an electrochemical cell or accumulator. The resultant polarization voltage response developed across the cell is repetitively sampled at a plurality of points at corresponding positions during each of the repetitions of the waveform. Piecewise numerical integration is performed by generating the sum of corresponding sample points from consecutive positive half cycles, and the separately the sum for the negative half cycles, respectively. These sums are then each divided by the number of samples (N) yielding an average value exhibiting a "Square Root of N" noise reduction factor. The relative shape and size of these averaged curves may be then analyzed or transformed as required to yield detailed information about the condition and future performance of the electrochemical cell (or battery). Data may be converted to digital format, using either a linear or exponentially spaced sampling algorithms. Linearly sampled data is suitable for processing with integral Laplace and Fourier transforms, while exponentially sampled data is useful for immediate graphical presentation of test results.

For chemical systems embodying reversible or quasireversible redox reactions, it has been determined that, when the galvanic stimulation takes the particular form of an even numbered sequence of square pulses of alternating polarity and of sufficiently small amplitude to ensure that cell response will be linear, the net charge transferred to the cell will be precisely zero. In addition, the resultant polarization voltage response will exhibit a characteristic symmetry about the time axis. Such a technique is, by definition, non-invasive. Any loss of symmetry detected in the polarization response is necessarily indicative of a breach of one of the three initial conditions, and thus may serve as an indicator thereof.

When this technique is used to test batteries, immediate assessment of condition and relative state of charge can be made by plotting deviations from the mean values. Mean value data is obtained from measurements of many knowngood cells of the particular type. The deviations from these mean values obtained for the cell under test are then calculated to produce a fingerprint that can be interpreted visually for qualitative understanding.

Laplace transform techniques can be applied to calculated impedance parameters to construct models of time domain behavior for individual underlying processes, while the Fourier transform (and particularly the DFT) permits translation of the data into the frequency domain.

The technique facilitates rapid acquisition and analysis of energy cell state of charge and overall condition. The technique permits ease of use and efficient, portable operation. The technique also facilitates analysis of cell state of charge and condition. An apparatus according to the technique may include a self centering and polarizing circuit with respect to connection of test leads to a device under test that exhibits an intrinsic bias potential. To this end, the circuitry may include four connectors that include test leads each supplied with suitable connecting clamps, clips or fixturing. The connectors are affixed to terminals of the device under test, so that the connection for the non-inverting preamplifier input and the current drive signal are made to the same terminal of the device under test, while the connections for the inverting preamplifier input and the current receive signal are made to the opposite terminal of the device under test. This connection method is known as a Kelvin connection.

The technique may provide a symmetric current signal to a cell under test to produce a non-invasive test method. The technique may measure and report the voltage response of the cell under test to determine state of charge and cell condition, and may process the voltage response of a cell under test to remove from that signal a time invariant component to isolate a time variant component.

The technique may be used with different types of energy devices. For example, detection of asymmetry between positive and negative half-cycle responses may indicate a nonlinear transfer function, indicative, for example, of semiconductor diode behavior within an electrode, characterizing severe discharge in lead acid cells. Similarly, the relative age of lithium ion cells (number of charge/discharge cycles experienced) can be estimated from relative separation of polarization curves when calls are otherwise equated for open circuit voltage.

A time variant component of the voltage response of a cell under test may be sampled at periodic intervals to produce a linear representation of the signal. A time variant component of the voltage response of a cell under test may be sampled at logarithmic intervals to produce a logarithmic representation of the signal. Cell condition data may be acquired in an automated fashion under microprocessor control. Cell condition data may be acquired and stored in a format useable by an associated data processing device. A graphical transformation of cell voltage response data may be implemented to facilitate evaluation and analysis of state of charge and overall cell condition.

Repetitive test signal summation and integration techniques may be used to reduce the interference of ambient noise. Test signals of fixed frequency may be provided, as may be test signals of different frequencies. A well-defined test signal may be used to ensure evaluation of the cell under test at a wide range of waveform periods. The voltage response of a cell under test may be created and captured in a form to facilitate analytic evaluation of the cell using Fourier, Laplace and related techniques. Similarly, the voltage response of a cell under test may be created or captured in a form to facilitate evaluation by neural networks.

The technique permits rapid and accurate acquisition of information relevant to the state of charge and qualitative information about an electrochemical energy storage device, commonly referred to as a battery. The technique may provide a precision test instrument that produces precise driving signals to create polarization response voltages as a function of time which are developed across an electrochemical cell or battery of cells in response to a galvanic (current) stimulation, and may be captured to present data reflecting state of charge and cell quality information. The technique includes specific noise reduction and small signal detection and processing capabilities to permit the use of non-invasive driving signals. The technique further relates to acquiring and manipulating data to facilitate analysis and presentation of detailed information rapidly and efficiently.

The invention features determining polarization voltages developed in response to an excitation signal applied to a device. Such polarization voltages may be determined by using a controlled-current source configured for connection to a first terminal of the device, a controlled-voltage source configured for connection to a second terminal of the device, a sensor configured to sense a voltage across the device and to produce a sensor signal in response to the voltage, and a controller connected to the controlled-current source, the controlled-voltage source and the sensor. The controller is configured to determine polarization voltages in response to the sensor signal.

Embodiments of the invention may include one or more of the following features. The device may be an electrically-responsive element, network, electrochemical cell, or battery. The controlled-current source and the controlled-voltage source may be configured to provide self-centering and autopolarity relative to the device. To this end, the controller may be configured to provide self-centering relative to the device by supplying a voltage equal to one half of the bias voltage of the device to the controlled-voltage source. The controlled-current source may be configured to provide a symmetric, bipolar square wave to the first terminal of the device.

The controller may include a microprocessor and associated circuitry. Alternatively, the controller may be made up of analog circuitry.

Kelvin connection circuitry may be used to attach the components to the device. The Kelvin connection circuitry may include a first lead connected to the controlled-current source and configured for connection to the first terminal of the device, a second lead connected to the controlled-voltage source and configured for connection to the second terminal of the device, and third and fourth leads connected to the sensor and configured to be connected to, respectively, the first and second terminals of the device.

A feedback loop may be employed between the sensor and the controller. The feedback loop may be configured to eliminate a nonvarying or slowly varying portion of the voltage across the device (e.g., the bias voltage of the device) so that the sensor signal reflects only a portion of the voltage across the device.

In another general aspect, the invention features determining polarization voltages developed in response to an excitation signal applied to a device by connecting a controlled-current source to a first terminal of the device, connecting a controlled-voltage source to a second terminal of the device, and using a controlled-current source to apply a bipolar, symmetric square wave to the device. A voltage is sensed across the device to produce a sensor signal, and the sensor signal is modified to eliminate effects of a nonvarying or slowly varying portion of the sensed voltage. Polarization voltages are then determined in response to the modified sensor signal.

The controlled-voltage source may be controlled to produce a voltage having a magnitude equal to one half of the bias voltage of the device.

A graphical representation of the polarization voltage suitable for immediate visual inspection and analysis may be generated. The polarization voltage may be compared to baseline data for a class of devices to which the device belongs to assess a relative condition of the device.

Polarization voltage data obtained through testing with a symmetric bipolar square wave can manipulated in a fashion advantageous for a particular form of graphic representation suitable for immediate visual inspection and analysis. The polarization voltage data also can be used to assess the relative condition of an electrochemical cell or battery. Polarization response profiles are obtained for the device under test and compared to baseline data stored in memory. Specific differences in the shapes of the response patterns are indicative of specific problems within the device under test and, for specific types of devices under test, only certain data points, corresponding to specific polarization frequencies, need be evaluated to make the necessary determination.

A DC offsetting signal may be permitted to vary during the test period, such that polarization voltage data may be obtained through testing with a symmetric bipolar square wave concurrently with DC charging or discharging current being supplied to the device under test.

Changes in the polarization voltage of a cell can be used to accurately determine the end-of-charge point, which is reached when at least one of the chemical species needed for the recharge reaction has been effectively depleted, whereupon the equivalent Faradaic resistance (characteristic of the electrode-electrolyte interface) commences a precipitous increase that is manifested as a commensurate increase in the measured polarization voltage, and is especially apparent at relatively low equivalent polarization frequencies in the range of 1 to 0.01 Hertz. When such a rise is detected, it may be used as an indication of end-of-charge, and so employed as a stopping signal for a concurrent charging excitation.

The waveforms produced may be arbitrary. That is, the waveforms may be comprised of sine waves, triangle waves, ramps, pulses, complex parametric shapes or any combination thereof, in order to assess the various time dependent characteristics of galvanically stimulated cells and electrical networks.

The time dependent evolution of polarization voltages may be measured according to various digital sampling time schedules, such as those characterized as a constant $\Delta T$ schedule, wherein the time elapsed between successive samples is held constant; a logarithmic $\Delta T$ schedule, wherein the time elapsed between successive samples is increased in an exponential manner; or a parametric $\Delta T$ schedule, wherein the time elapsed between successive samples is determined by a set of values programmed into the prestored software. Nonlinear sampling schedules, when properly constituted to accurately capture the polarization events of interest for a particular chemistry, confer the advantage of a considerable reduction in data collection and storage requirements. In the ultimate case, only a very few data points may be required, allowing the entire method to be incorporated into a single, relatively simple, integrated circuit.

Other features and advantages of the invention will become apparent from the following description, including the drawings, and from the claims.

BRIEF DESCRIPTION OF THE DRAWING

FIGS. 1A–1D are block diagrams of a test device.

FIGS. 4A and 4B are graphs of a voltage response across a cell under test.

FIGS. 5A and 5B are graphs of a voltage response across a cell under test.

FIGS. 6A–6C are graphs of a half cycle of the voltage response across a cell under test.

FIGS. 7A and 7B are graphs of a tester output signal.

FIG. 8 is a graph of a logarithmic map of a tester output signal.

FIGS. 9A and 9B are graphs of a tester output signal.

DESCRIPTION

Figure 1A:
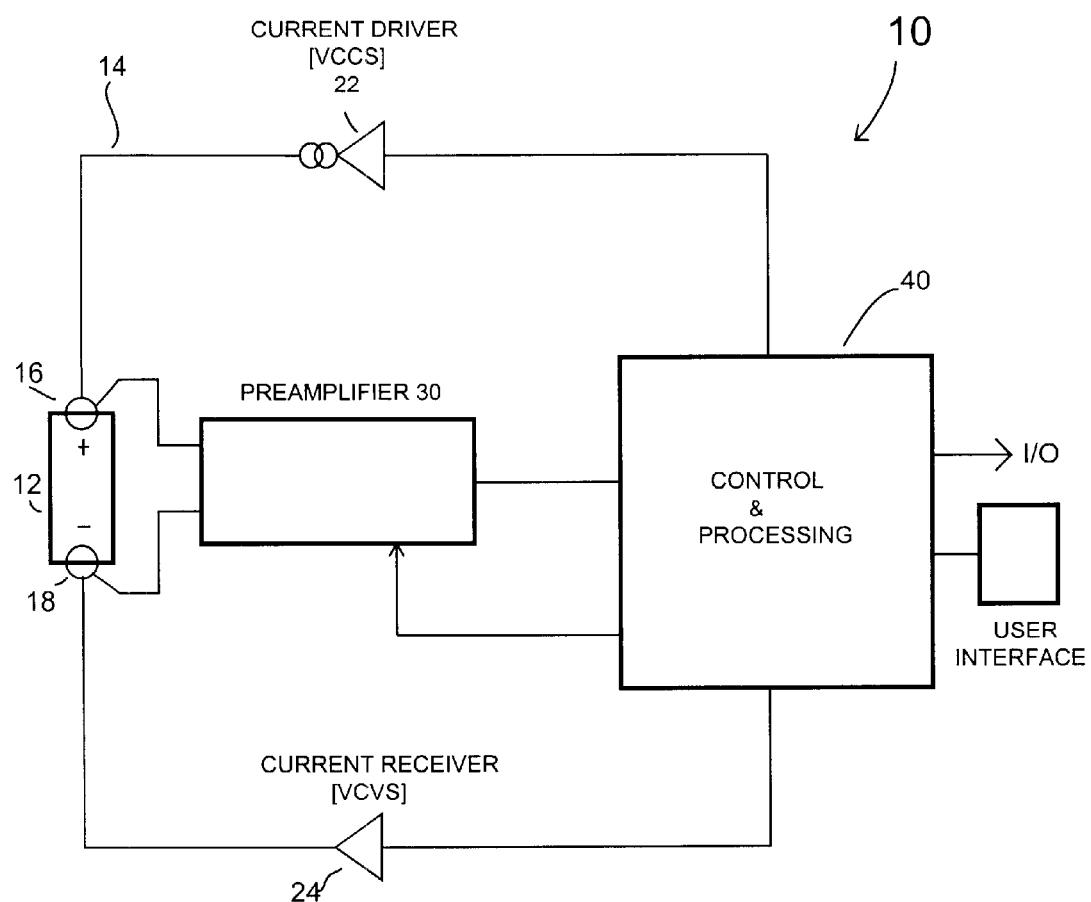

Referring to FIG. 1A, a tester 10 develops a time varying polarization voltage across a device under test 12, and detects, measures and processes the polarization voltage. Device 12 has two electrical terminals, which are hereinafter designated as a positive terminal 16 and a negative terminal 18. A current signal 14 is imposed across the device 12 by a current driver 22. Current driver 22 may include conventional components. In one implementation, the current driver 22 includes a voltage controlled current source. In general, current driver 22 must be capable of producing a sustained bipolar current drive signal 14 which takes the form of a precise square wave. Current driver 22 is electrically connected to one terminal of device 12. The opposite terminal of device 12 is similarly connected to a current receiver, which may include a voltage controlled voltage source. Current receiver 24 exhibits negligible output impedance for the drive signal 14 provided by current driver 22 and transmitted through the device under test, and so serves as a virtual AC ground. A preamplifier 30 also is connected across the terminals of device 12. The preamplifier 30 senses, isolates, and amplifies the polarization voltage induced across the internal impedance of device 12 by the current 14 supplied by driver 22. System control, data processing and I/O functions are provided by a microprocessor 40, such as an Intel 80386 processor, and associated analog and digital components.

Kelvin Connection & Signal Detection

Device 12 is connected to the tester 10 using four leads connected so that each lead makes an individual connection directly to the appropriate terminal of the device 12. This connection method, known as a Kelvin connection, reduces the interaction between the driving circuitry (i.e., current driver 22, current receiver 24, and their associated connection leads) and the sensing circuitry (i.e., preamplifier 30 and its associated connection leads). By virtue of the direct connection of the preamplifier test leads to the terminals of device 12, and the relatively high input impedance of preamplifier 30, no drive current flows through any part of the sensing circuitry, and the detected polarization voltage is completely attributable to device 12. Referring also to FIG. 1B, detection and analog processing of the polarization response signal is provided by preamplifier 30, which may include four operational amplifiers 54, 56, 58 and 64 to accomplish voltage sensing, DC offset compensation, and amplification functions of the preamplifier 30. Terminals 16 and 18 of device 12 are electrically connected to respective positive and negative inputs of an instrumentation amplifier 54, which may take the form of a differential amplifier having a very high impedance, unity gain, and excellent common mode rejection. A signal 55 produced by instrumentation amplifier 54 is equal to the potential difference between the inputs of the amplifier 54. When device 12 is an electrochemical cell or battery having an intrinsic DC bias potential of its own, signal 55 will include this bias potential to which is added a polarization voltage component that is developed across the internal impedance of device 12 by the drive current 14.

Because the signal of interest is only the relatively small polarization voltage component of the full measured device potential, it is useful to remove the effects of any DC bias component from the output of preamplifier 30. This is accomplished using an offset generator 50 that supplies a suitable DC offsetting voltage signal 52 to an inverting scaling amplifier 64. A summing amplifier 56 combines the inverted offset voltage produced by the scaling amplifier 64 with the signal 55 to produce a signal 57 corresponding to the polarization voltage. The value of the offset voltage is determined by the microprocessor 40.

As noted, preamplifier 30 provides an output signal 55 equal to the total potential present between the terminals of device 12. This output is conveyed to a low-pass filter 60 that is configured to remove higher frequency components from the signal 55 to provide a filtered DC voltage 61 to a multiplexer 62. The microprocessor 40 controls the multiplexer 62 to route this signal to an A/D converter 64 that in turn conveys a digital representation of the signal 61 to microprocessor 40. The microprocessor then issues digital commands to offset voltage generator 50, which may include a digitally-controlled voltage source. The offset voltage generator 50 responds by providing an offsetting voltage 52 having a magnitude equal to one half of the DC potential present across device 12, and having the same relative polarity as terminal 18 of device 12. The offsetting signal 52 is conveyed to the scaling amplifier 64, which amplifies this signal by a factor of negative two to produce an output 65 that equals the DC component of signal 55 in magnitude, but is of opposite polarity. As noted, the signals 55 and 65 are conveyed to summing amplifier 56, which sums them to produce the signal 57. This, in effect, subtracts the DC bias component 65 from the signal 55 to remove the DC component associated with any intrinsic DC potential present in device 12 and isolate the polarization voltage component as signal 57. Signal 57 is thereafter provided to the input of a high gain amplifier 58, which has an amplification factor of about 1500, to produce a polarization voltage output 32 that represents the signal of interest in a form conveniently used by digital and analog instruments.

Signal 32 is conveyed to a unity gain buffer 37 that provides an isolated output for test bed instrumentation, such as an oscilloscope or other visual display device. The buffer 37 prevents interaction between preamplifier 30 and the analog instrumentation 38.

Digitization of Polarization Signal

Signal 32, representing the isolated and amplified polarization voltage, is supplied to an A/D converter 34 that converts the signal 32 into a digital signal 36 having a series of digital samples. The converter 34 is controlled by microprocessor 40, which forwards a clock signal 42 to the converter. Each digital sample represents the instantaneous value of signal 32 at a point in time corresponding to a clock pulse. The digital signal 36 is passed to microprocessor 40 for processing, storage and transmission.

Auto Centering/Auto Polarity Function

Offset signal 52 is also used to provide a self centering effect. Signal 52 constitutes the input signal to current receiver 24, and, as noted above, is set by microprocessor 40 to have one half the magnitude of the DC bias voltage of device 12 and the same polarity. A primary attribute of the current receiver 24 is that its output voltage is maintained at a level equal to its input voltage, irrespective of the output load current. This means that terminal 18 of device 12, which is connected to current receiver 24, will be maintained at a voltage equal to one half of the total DC bias of device 12, having a polarity equal in sign to the actual polarity of terminal 18 of device 12, as determined previously by the microprocessor 40.

Figure 2:
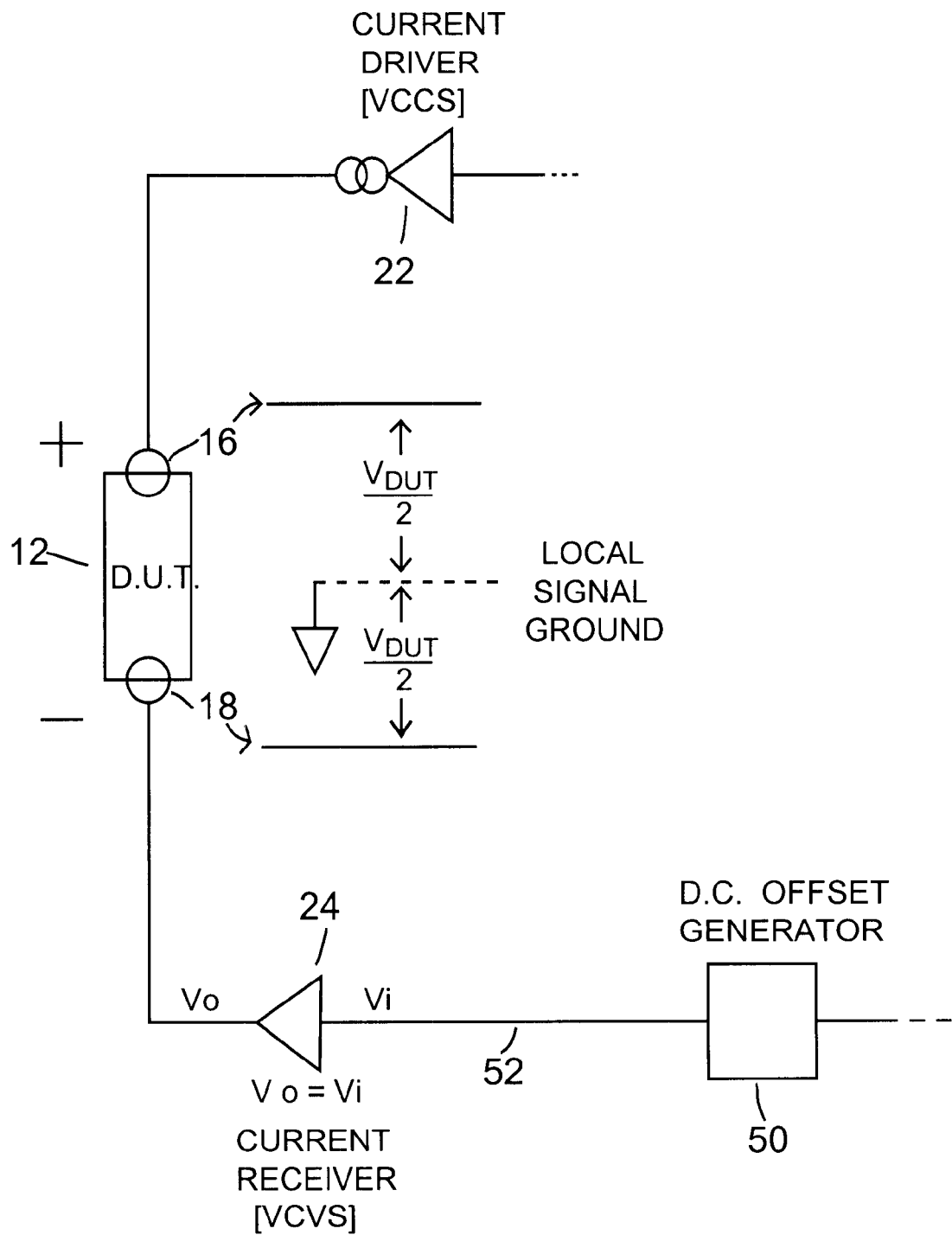
FIG. 2 is a block diagram illustrating a centering effect of the test device of FIGS. 1A and 1B.

Terminal 16 of device 12 is electrically connected to current driver 22, which is a voltage controlled current source exhibiting very high output impedance. As such, the output of current driver 22 will assume whatever voltage potential, with respect to the relative potential of device 12, is required to ensure delivery of the proper output current as is functionally determined by a controlling input signal 21. Thus, by employing both a virtual ground current receiver 24 that maintains a controlled DC potential, along with a highly compliant current driver 22, the DC bias voltage presented by the device 12 is, in effect, centered with respect to local signal ground, as shown in FIG. 2. For example, if device 12 has a DC bias voltage of six volts, the positive terminal 16 of device 12, which is connected to current driver 22, will be three volts above ground, while conversely, the negative terminal 18 will be three volts below ground. This offers great advantages for portable implementations that operate using a battery pack power supply. By ensuring that the cell voltage will be centered about signal ground, the total battery pack voltage that is necessary to ensure proper operation of the electronic circuitry, is thereby minimized. Furthermore, this arrangement makes the relative polarity of the connections between the test system and the terminals of the device under test 12 irrelevant. Thus, if device 12 is attached to the system with its negative terminal 18 connected to current driver 22 and its positive terminal 16 connected to current receiver 24, the control loop described by preamplifier 30, low pass filter 60, multiplexer 62 A/D converter 64, and microprocessor 40, will produce an offset voltage signal 52 of the same polarity as terminal 16 of device 12. That signal serves as the input to current receiver 24, which then presents that voltage and polarity back to device 12, properly matching the polarity of device 12 and again centering the DC bias voltage of device 12 about the local signal ground.

Generation of Drive Signal

Figure 3A:
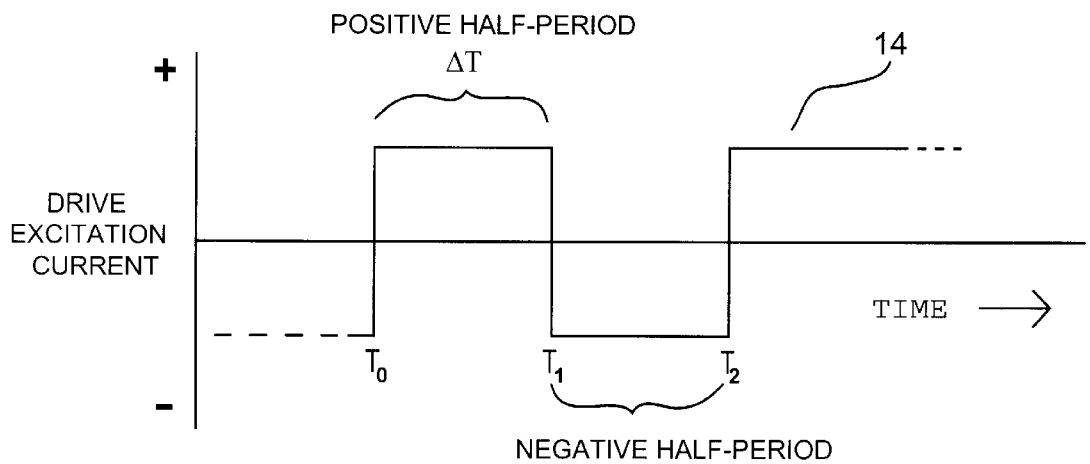
FIGS. 3A and 3B are graphs, respectively, of a single frequency driving signal used to evaluate a cell under test and a nominal cell potential.
Figure 3B:
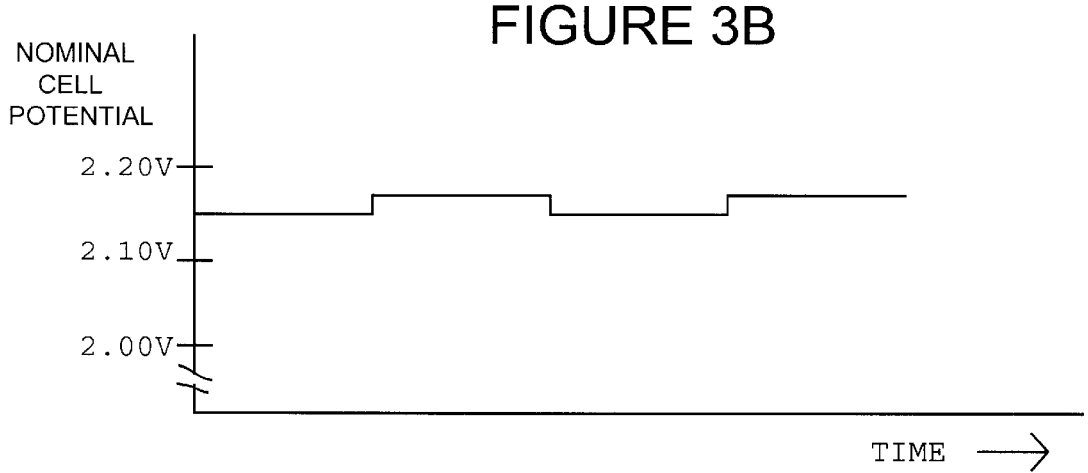

The control signal 21 for current driver 22 is provided by Waveform Generator 48, under control of the microprocessor 40. The control signal takes the form of a precise square wave voltage signal having several important characteristics, as may be seen in FIG. 3. A primary characteristic of this signal is that is exhibits symmetry about the horizontal (time) axis. As indicated in FIG. 3, a single cycle of signal 14 may be subdivided into two distinct half-cycles of equal duration. The positive half-cycle from to to $t_0$ to $t_2$ and the negative half-period from $t_1$ to $t_2$ must be of equal and constant duration for each full cycle of the waveform. To ensure accurate charge balancing over the course of each waveform cycle the duty cycle of each square wave must be 50%, and additionally, the half-cycle timing variance (skew plus jitter) within a whole cycle should preferably not exceed 20 nanoseconds. Similarly, the signal amplitude during a single cycle must be constant. By ensuring symmetry both in the amplitude and time domains, the galvanic excitation provided to Device 12 will have a net DC current value of zero when summed over an integral number of cycles. The amplitude and the frequency of signal 14 may take a number of different values, but to ensure that the drive signal does not significantly alter the state of charge of device 12, the amplitude is advantageously set so that the peak to peak value of the polarization voltage produced across device 12 does not exceed several millivolts per individual cell, and furthermore that precisely an integral number of cycles are generated at each specific frequency. To ensure detection of a very fast process or phenomenon within Device 12, it is necessary that the rise time of the square wave drive current exceed, by a substantial margin, that of the process to be detected; otherwise, the measured response will reflect only the properties of the driving signal and circuitry, not the device under test. Hence, it is preferred that the square wave rise time be on the order of one microsecond, in order to ensure that an accurate and measurable polarization response is created.

To allow direct determination of the current output of current driver 22, a current sensing resistor 23 is connected in series with the output of current driver 22. The drive current passes through this resistor, developing a proportional voltage which is detected by differential input current sense amplifier 25, whose output 27 connects to multiplexer 64, which is under the control of microprocessor 40. At various times, the multiplexer may be switched to route the current sense signal 27 into A/D converter 64, whereupon the digitally sampled drive current information is conveyed to the microprocessor for processing and storage.

Microprocessor Functions

Microprocessor 40 is a stored program microprocessor commercially available such as the Intel 80386 processor. Microprocessor 40 provides outputs to, and accepts inputs from, user interface 44 which includes a keypad and visual display microprocessor 40 is further provided with a standard serial interface 45 to permit data exchange between the system and an external computer or other digital device. Microprocessor 40 is responsible for overseeing and managing the operation of the overall system. Microprocessor 40 may also be provided with random access memory 46 of conventional design, and sometimes other supporting devices as well, to permit the storage and manipulation of user inputs, data and outputs.

Circuit Variations

Figure 1C:
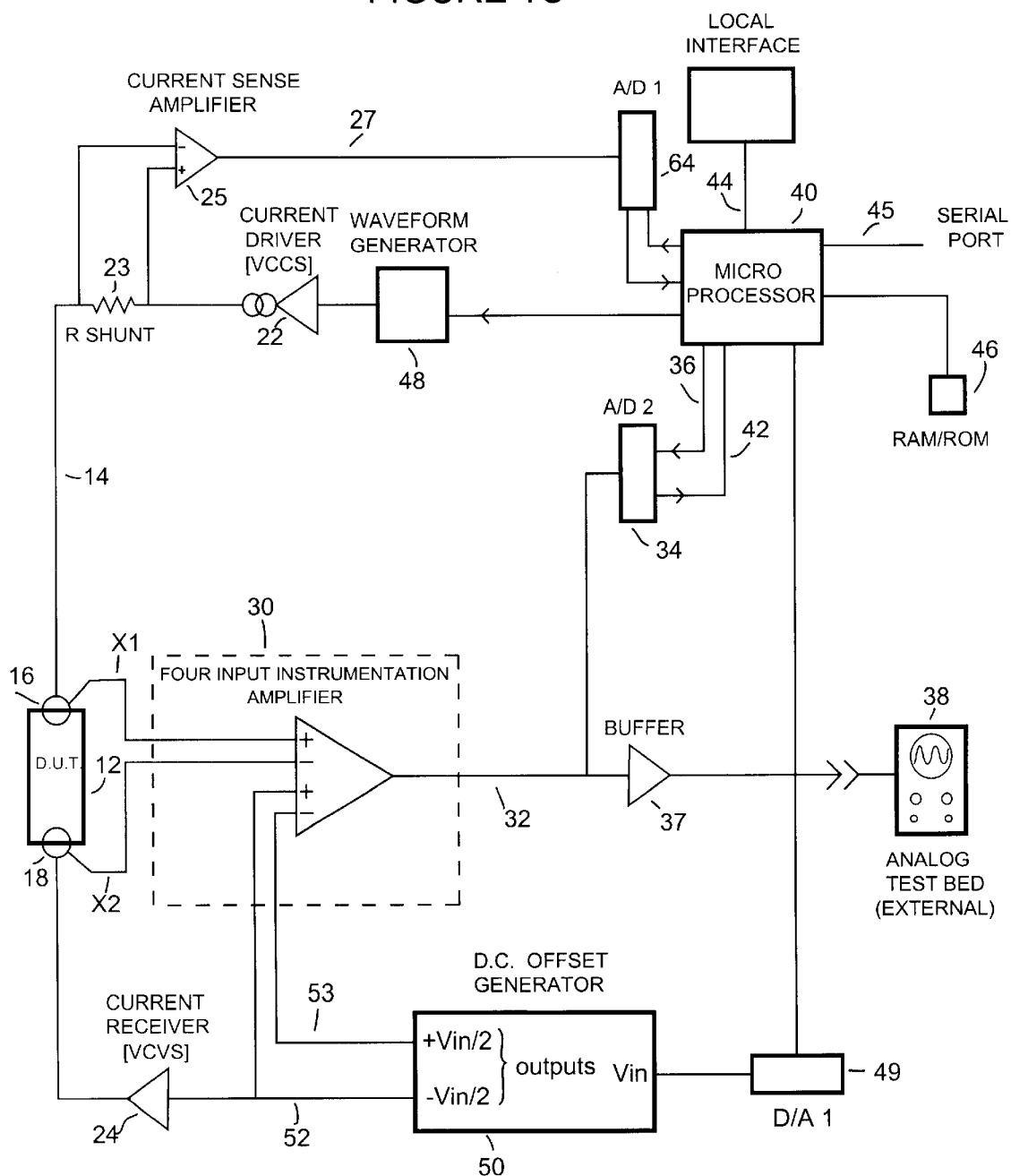

Variations on the circuit of FIG. 1B are provided in FIGS. 1C and 1D. FIG. 1C illustrates a variation in which the preamplifier 30 is implemented using a four input instrumentation amplifier. FIG. 1D illustrates an implementation in which the microprocessor is removed from the feedback loop.

In the implementation of FIG. 1C, the DC offset voltage generator 50 develops two voltage signal outputs 52, 53 in response to an analog input control signal. These outputs are each equal in magnitude to one half of the magnitude represented by the input control signal, but are of opposite polarity (e.g., $V_{out1}=(+V_{in}/2)$; $V_{out2}=(-V_{in}/2)$). The preamplifier 30 of the circuit includes four voltage input terminals and one output terminal, the first two inputs (designated A and B) are of the non-inverting sense with respect to the output signal, and the second two inputs (designated C and D) are of the inverting sense with respect to the output signal. The output signal is a voltage that includes a highly amplified copy of the algebraic sum of the four input voltage signals (i.e., $V_{out}=k(A+B-C-D)$).

The microprocessor 40 may commence a preprogrammed sequence of operation, either as a result of a user input command, or (in the case of an automatic instrument embodiment) as a result of detecting a change in the voltage present across the two preamplifier input circuits. Such a voltage change signals the completion of a suitable connection to an external device under test.

The preprogrammed sequence may have an initial function of providing a proper control signal to a DC offset generator so as to null out the effect on the preamplifier of the bias voltage present across the terminals of the device under test, and to center the bias potential exhibited by the device under test about local analog ground. This may be achieved as follows. First, the controller receives a sense signal, via the analog-to-digital converter 34, that is representative of the voltage output of the preamplifier and is of the same polarity, but substantially amplified in magnitude, as the potential present across the externally connected preamplifier input circuits, due to the intrinsic bias of the device under test. Next, in response to this sense signal, the controller, via a digital-to analog converter ("DAC") 49, commences outputting a constantly increasing control signal to the DC offset generator. The control signal has the same relative polarity as the output of the preamplifier, and continues to increase in magnitude as long as the output of the preamplifier is other than zero. In effect, this represents the behavior of an ideal non-inverting integrator. The output of the DAC is conveyed to the input of the DC offset voltage generator. The DC offset voltage generator is provided with two outputs having absolute magnitudes that are always the same and equal to one half of the magnitude of the controlling signal, but are possessed of opposite relative polarity. The negative output, of opposite polarity to the generator input, provides the controlling input to the current receiver. Both outputs are connected to the preamplifier, such that the positive output is connected to preamplifier input D which has an inverting sense, and the negative output, of opposite polarity to the generator input, is connected to preamplifier input C which has a non-inverting sense. Thus, provided the voltages presented by the DC offset generator will algebraically cancel the voltage presented by the device under test, the DC potential of the preamplifier output will be zero.

If for example, the device under test is connected so that its positive terminal is connected to both the current driver and the positive input of the preamplifier input, and conversely, its negative terminal is connected to the current receiver and the negative input of the preamplifier, the output voltage of the current receiver will be seen to become increasingly negative with the passage of time, forcing the device under test's negative terminal, which was initially at ground, to assume an increasingly negative value. Note that the positive terminal of the device under test is connected to two high impedance nodes (e.g., a high impedance input and a high impedance current source). As such, though the intrinsic bias potential of the device under test remains constant, the relative potential of the positive terminal will appear to become increasingly negative.

The output of the DAC will continue to slew until the voltage presented at the output of the current receiver, as provided by the DC offset generator, is equal in magnitude to one half of the intrinsic bias potential of the device under test, and of the proper polarity such that the algebraic sum of the four preamplifier inputs will be precisely zero, leading to a preamplifier output of zero. At that point, the input to the non-inverting integrator, which in this case is simulated by a microprocessor, is zero. This causes the slewing of the output of the DAC to cease.

The net effect of this differential integrator servo control loop is twofold. First, regardless of the actual connection of the test leads (i.e., it does not matter whether the current driver is connected to the positive terminal of the device under test or not, and likewise for all three other test leads, respectively), the loop action will cause the bias potential of the device under test to be precisely centered about local analog ground. Second, the DC bias of the device under test with respect to the preamplifier is effectively nulled out, allowing very small polarization signals present differential across the terminals of the device under test to be highly amplified by the preamplifier and still appear centered within its effective output dynamic range.

This technique has the further benefit of allowing a substantial decrease in the required power supply voltages (with the attendant decrease in cost, and in the case of portable embodiments, a substantial decrease in size and weight) which are required to accommodate a device under test of given bias potential, as compared to traditional DC coupled methods wherein one terminal of the device under test remains fixed at relative ground, and the other terminal may appear either above or below ground by an amount equal to the relative bias voltage, depending on the polarity of the test lead connections. Of course, the problem of polarity could be simply avoided by employing capacitive coupling techniques, but this severely affects the accuracy of any measurement at low frequencies, and renders measurement impossible for DC excitation signals.

The offset generator may be configured to provide either a either a fixed DC offsetting signal or a tracking DC offsetting signal. The signals output by the offset generator may then either be held at a fixed value until the termination of the present testing sequence (representing fixed DC bias offsetting), or may vary under control of the microprocessor (via the virtual integrator function) during the duration of the testing period representing tracking DC bias offsetting to compensate for changes in the bias voltage of the device under test caused by charging or discharging currents from some external source, or as a result of any other variation in the bias potential of the device under test. Suitable algorithmic corrections can be applied to the polarization voltage data to compensate for the distortions created in the case of the tracking (integrator) operation.

In the implementation of FIG. 1D, resistors 81 and 82 are optional, and may be installed to provide bias current to buffers 83 and 84. Buffers 83 and 84 are unity gain amplifiers that exhibit high input impedance so as not to load, or draw current from, the device 12. Resistors 85–88 may have values of about 2000 ohms, with values matched to within 0.01 percent to provide adequate common mode rejection. Amplifier 90 is of the high gain instrumentation type, having high impedance inputs. Amplifiers 93 and 96 constitute, with their associated componentry particularly with respect to resistors 94 and 95, which are very well matched so that amplifier 96 behaves as a highly accurate unity gain inverter, a differential output integrator, having the known characteristic that its outputs will remain constant provided its input is zero. The differential integrator outputs are connected to resistors 87 and 88, in a manner that the integrator outputs will automatically adjust to force the net DC value of the preamplifier output to always maintain a zero value. The time constant of the integrator is set by the product of resistor 91 and capacitor 92, and must be adjusted so that the lowest input frequencies of interest are not substantially attenuated. In an alternate configuration, this time constant may be made adjustable under external control, as, for example, by the use of a digitally controlled resistance element in place of resistor 91.

Operational Description of the Technique & Analysis Algorithms

Polarization voltage signal 32, shown schematically in FIGS. 3 and 4, represents the voltage response developed across the device under test by the drive current. Because the drive current signal is symmetric and periodic, and of sufficiently small amplitude to ensure linear response in device 12, the resultant polarization voltage will exhibit similar symmetries. In most cases of interest, particularly for electrochemical accumulators, the polarization response exhibits several recurring characteristics. At time $t_0$, corresponding to the abrupt positive transition of the drive current, the polarization response undergoes a similarly rapid change. Due to the very short rise time of the square wave drive current, this stepwise change of the response represents the time-invariant part of the polarization, and is therefore attributable to the ohmic (real) component of the device's impedance. As can be seen in the figures, there may also be a small overshoot, due to the combined inductive characteristics of device 12 and the test fixturing itself. Proper attention to fixturing will reduce stray inductances to negligible levels and allow the device's own inductive response (which typically lasts from one to several hundred microseconds) to predominate.

Immediately following the decay of any inductive overshoot and for the remainder of the half cycle, the response is seen to increase monotonically in magnitude in a non-linear fashion (unless the device appears purely resistive leading to a simple flat topped square wave response). In particular, the slope (first derivative) of this curved response is seen to progressively decrease throughout each half-period, and is recognizable as being similar to the well known exponential function (1-e$^{1/t}$), which is used to describe electrical circuits containing resistive and capacitive elements. This curved portion is hereinafter considered the time-varying component of the polarization response, and is often composed of at least two distinct portions, arising from processes having different underlying time constants. These are identified in FIG. 4B as the fast (74) and slow (75) processes, respectively, and exhibit commensurately differing curvature. Fast processes tend to expend themselves in the early part of each half-cycle, while the later tail section takes its shape from slow process and so changes relatively gradually over time.

At $t_1$, the next stepwise current transition occurs, whereupon a polarization curve of similar shape appears, but now tending downward. Provided that neither the condition nor state of charge of device 12 changes appreciably during several consecutive excitation periods (square wave cycles), it is apparent that the shape and size of overall response waveform will remain relatively constant as well. In general, the polarization voltage signal 32 is well behaved and, except for a discontinuity at each stepwise edge transition, is continuous.

The polarization response is digitized by converter 34, according to a sampling schedule controlled by the microprocessor 40. To accurately capture the all the details of an arbitrary waveform, digital sampling theory teaches that the sampling rate must be at least twice as high as the highest frequency component of interest to avoid aliasing errors, and in practice, ten-times oversampling is used to ensure the fidelity of the digitized waveform.

Conventional digitization techniques employ a fixed interval (e.g., $\Delta T$=a constant) sampling schedule, wherein the analog wave form is repeatedly sampled and digitized, synchronously with a sample clock control signal having a constant frequency (f=1/$\Delta T$). As is well known to practitioners of the art, constant $\Delta T$ sampling is required if the data is to be analyzed using discrete transforms (Laplace or Fourier). The attainable resolution of such transform analyses is limited by the magnitude of $\Delta T$, in that decreasing $\Delta T$ (that is, increasing the sampling rate) allows faster processes, or equivalently, higher component frequencies, to be resolved. Since typical electrochemical cells often exhibit transient responses in the microsecond range, particularly when galvanically excited by a square wave, it would appear that a very high sampling rate is preferred. Furthermore, when testing electrochemical accumulators whose behavior is governed in part by relatively slow kinetic processes such as diffusion, a very low frequency square wave excitation (0.1 and 0.01 Hertz) is required to elicit a significant polarization response.

When such a slow waveform is repetitively sampled at a high rate, a very substantial number of digitized values will be accumulated, especially if the test procedure includes many cycles of the waveform to. ensure adequate noise averaging. For many applications, particularly low cost commercial or portable device embodiments, the burden of raw data storage and management presented by such a large data set is prohibitive.

Although constant $\Delta T$ sampling of a device's response may be desirable and necessary for certain analytical transform methods, a valuable aspect of the present invention is a novel non-linear sampling method wherein $\Delta T$ is progressively increased within each half cycle.

Fast processes run to completion within the first few tens of milliseconds of each half-cycle. To capture the details characterizing these early, rapidly evolving events, fast sampling is surely necessary.

Conversely, there are other slower processes which evolve over a time scale of many seconds. These are manifest in the tail section with its much gentler slope and commensurately diminished high frequency content, thus allowing a substantially relaxed sampling schedule to be employed.

Therefore, when the actual time domain response of the evolving polarization voltage is of interest, a non-linear sampling schedule is prescribed whereby the inter-sample time is progressively increased in a particular fashion throughout each half-cycle. Excellent resolution is achieved for both the early, fast as well as for the later slower polarization processes, with a total accumulation of far fewer actual data points as compared to the conventional constant $\Delta T$ sampling paradigm.

The preferred non-linear sampling sequence is based on a geometrically increasing series of inter-sample delay times $\delta t_i$, each of which represents an integral number of base clock periods $\Delta T_B$ derived from a separate fixed frequency oscillator, preferably operating at one megahertz or higher. The general algorithm for generating an appropriate series of sample events is based on an exponential relationship:

$$\delta t_i = [\Delta T_B] \times [K_{(a \times i)}], \, i=0, 1, 2, \ldots, N$$

where $\delta t_i$ represents the time delay of the ith sample with respect to the preceding step transition, $\Delta T_B$ is the period of the base clock (typically 1 microsecond), and K and a are appropriately selected constants. Note that when the index i increments uniformly as shown above, the ratio of adjacent time delay values will be a constant value equal to $[\Delta T_B] \times [K^{(a)}]$. If K is set to 2 and a is 1, then as i ranges from zero to some limit N, a simple binary series of time delays is generated, e.g., {1 ms (delay of first sample from step), 2 ms, 4 ms, 8 ms . . . }. Moreover, in some cases, it may be preferred to omit the first few samples in each series, particularly to avoid the peak caused by the inductive behavior of the device 12. By appropriate selection of the three constants, a series can be constructed which provides many closely spaced samples during the early part of the polarization waveform where fast events occur, with fewer samples later on as the rate of change of the polarization voltage is diminishing. By resetting i to zero at each stepwise transition and then incrementing to N, an identical sampling schedule is generated for each half-period, greatly simplifying later analysis. FIG. 5A shows a typical polarization waveform, with seven exponentially spaced sampled data points {$S_i$, i=0 to 6} in each half-cycle.

1. First Transformation Step: Graphic Normalization & Averaging

Once the sampled data is collected, a normalization transformation is performed, whereby the time varying portion of the response is separated from the step-wise transition. This transformation may be applied to either uniformly or nonlinearly sampled data. Referring to FIG. 5, the polarization voltage value of $S_0$ (at time $T_0$), being the first sample following the transition, is used as a reference value, and is normalized by convention to a value of zero, as shown in FIG. 5B. The actual voltage difference between sample $S_0$ and $S_1$ is then calculated from the raw data and used as the y-value for $S_1$ in FIG. 5B; successive samples are treated similarly, leading to an upward tending curve that intersects the x-axis at time $T_0$. The magnitude of the difference, designated $\Delta E_0$, between sample $S_0$ and the final sample from the preceding half-period represents the size of the step. In FIG. 5B, the magnitude E of the step is plotted immediately to the left of sample point $S_{0'}$, at time $T_6$. In the graph, a line is shown connecting points $S_6$ and $S_0$. In fact, the transition of the polarization voltage between these points is very rapid, and so that point $S_6$, if plotted according to the time scale used for all the other sample points, would appear almost directly above point $S_0$. To facilitate interpretation of the graphic data in FIG. 5B, point $S_6$ has been shifted slightly to the left and a connecting line drawn to point $S_0$.

This transformation is applied individually to the data from each half-cycle, resulting in a set of vectors each containing N+2 elements (that is, samples $S_0$ to $S_N$, plus the $\Delta E_0$ value). To ensure that the data contains no artifacts, the information from the first two half-periods (one complete square wave cycle) may be omitted from subsequent analyses. The remaining M vectors are then divided into two groups (corresponding to positive and negative half-cycles, according to the sign of the excitation current) as shown in FIG. 3A. Each of these groups can be formally described as a two-dimensional matrix, comprised of M vectors, corresponding to the number of whole cycles used in the analysis, containing N+2 elements. Within each matrix, the values of corresponding elements are added together and these sums are each divided by the number of vectors in the matrix, yielding a single N+2 element vector representing the mean value of all the vectors in the matrix; these are designated as the mean positive vector and the mean negative vector.

As is well known to practitioners of the art, such an averaging technique when applied across M cycles of a periodic waveform, serves to reduce the effect of any random noise signals present within the raw waveform data, by approximately a factor of $M^{(0.5)}$.

Provided that device 12 is in an open-circuit state, and the internal chemical reactions behave reversibly for the small excitation signals employed (and do not exhibit any hysteresis effects), the shapes of the mean positive and mean negative vectors will be mirror images, reflected across the x-axis, specifically, when all the element values in the mean negative vector are multiplied by minus one (hence, are normalized by sign inversion), the resultant inverted negative mean vector should perfectly match the mean positive vector. Any difference between these two sign-normalized vectors indicates either that state of the electrochemical system within device 12 changed during the data acquisition period, or that device 12 was behaving in a nonlinear fashion as a result of the excitation itself. Provided that these mean vectors are congruent, they may be averaged, yielding a single vector characteristic of the device under test. A graphic presentation of these vectors is immediately useful for qualitative understanding of the device's performance and condition.

2. Second/Third Transformation Step: Linear to Log Time Axis

In the preferred embodiment, to further aid comprehension and understanding of the mean vector data, two additional transformations are undertaken. These require either that the data has been sampled according to an exponentially derived schedule, or that evenly sampled data has been resampled (decimated) according to a similar exponential rule. In FIG. 6A, a typical positive-going mean vector is shown as a continuous curve, with the actual sampled data points indicated. The accompanying legend provides the correspondence between each sample point (either identified by an integer index or as $\Delta E_0$) and its relative time of acquisition, in base clock periods, relative to the step-wise transition. The index values increment uniformly, while the time values increase exponentially.

When the data is replotted using the integer index values as the x coordinate, FIG. 6B results, now exhibiting a well-known logarithmic characteristic, due to the fact that the index of each point is directly proportional to the logarithm of its associated time value, $\delta t_1$. Note that each point in linear space finds correspondence with a unique point in logarithmic space. This transformation facilitates immediate visual identification of curvature changes which signal the occurrence of underlying processes. Details of fast processes are sufficiently spread out to be readily apparent, while the portion of the graph allotted to slower processes is relatively compressed without loss of any important information.

Figure 6C:
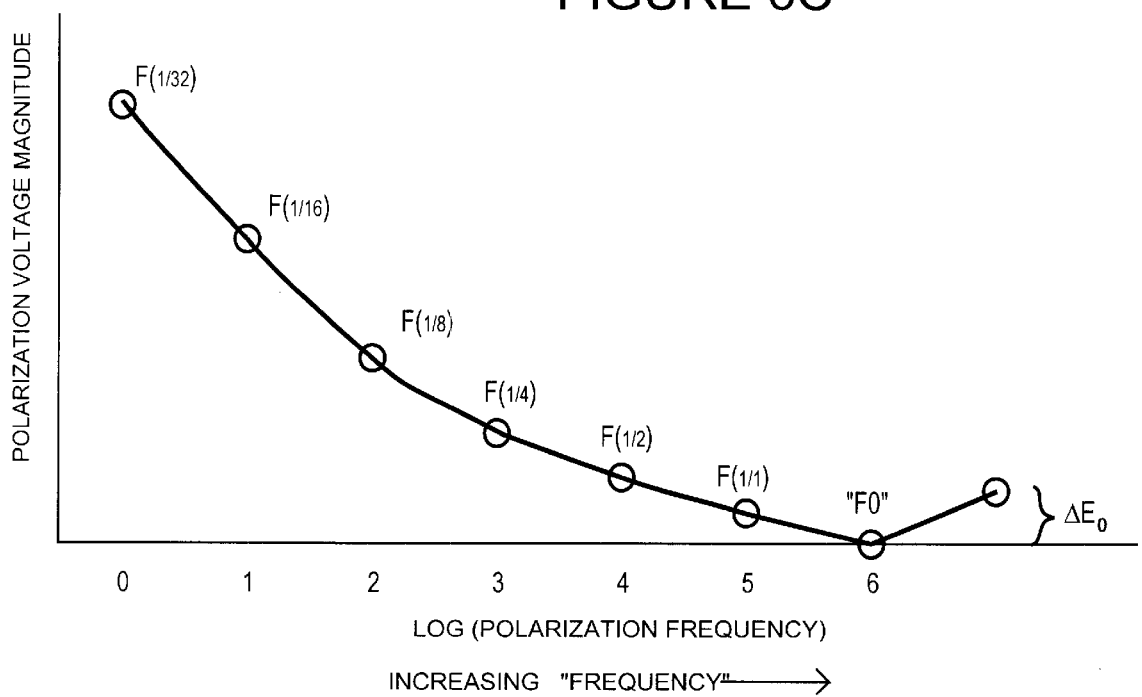

A further manipulation of the logarithmically transformed data is performed, by simply reflecting the curve about the vertical axis, as shown in FIG. 6C, and translating it horizontally so that the data point $S_0$, corresponding to the last element in the mean vector, becomes the y-intercept. These point are re-labeled in the graph, for reasons which now become apparent.

In the preferred embodiment, the information of interest relates to the change of polarization voltage as it evolves during each half-cycle of the excitation current. Each sampled data point is uniquely identified by an offset interval $\delta t_i$, measured with respect to the previous transition. It is useful to define a new quantity, the equivalent polarization frequency $F_{Pi}$, referred to hereinafter as the polarization frequency, which is equal to $1/(2 \times \delta t_i)$. In this manner, the point associated with the lowest measured polarization frequency (that is, having the longest interval since the prior transition) appears leftmost on the graph, with ascending frequencies proceeding to the right. The graph is again logarithmically scaled with respect to polarization frequency, such that while the ratio of adjacent frequencies is constant, succeeding points are uniformly spaced along the x-axis. This manner of presentation, plotting polarization frequency along the abscissa, has been found to be more convenient and more easily understood by those familiar with the art. Viewing polarization response in terms of frequency allows immediate comparison to the vast amount of Frequency Response data available in the "Impedance Spectroscopy" literature.

The present invention supports qualitative and quantitative analysis of energy cells. FIG. 7A provides a typical polarization response of a fully charged lead-acid cell. The peak to peak magnitude of the response across the cell is preferably not greater than several millivolts, to preserve linear response. FIG. 7B is the response of the same cell, in a discharged condition. Intermediate states of charge exhibit curves falling between these two extremes. At progressively higher charge states, the magnitude of $\Delta E_0$ decreases monotonically, while the steepness, and hence the overall height of the waveform, increases. The twelve curves presented in FIG. 8 represent data from a single 12 volt lead-acid automotive battery at different states of charge. The bold line represents the mean values of the sample population at full charge, while the others depict the response of the battery discharged and at ten ascending states of charge. This sequence reflects the changes produced by ten one hour charge events, each at the C/10 rate. For a fully charged battery, the curve appears steeply curved, with the polarization voltage increasing as the polarization frequency decreases. In the discharged state, the curve is nearly horizontal, exhibiting at the high frequency (right) end, a value approximately twice that of the charged unit. Intermediate charge values fall between these two curves.

Predictable real-time variations in the peak-to-peak amplitude of the polarization response can be used to detect the end of charge condition in a lead-acid battery. A constant frequency square wave excitation (at 0.1 Hz) is preferred, and the response is continuously monitored throughout the charging process. Under dynamic conditions (charging or discharging), the offsetting voltage is continually adjusted to compensate for the changing potential of the device under test. As the battery approaches its fully charged state, the amplitude envelope (peak-to-peak value of polarization response) exhibits a rapidly increasing magnitude, indicating an increase in the Faradaic resistance followed by the onset of the oxygen evolution reaction as the polarization voltage reaches the gassing point. The response curve of a healthy cell will appear smoothly curved, with a steeply sloped onset, gradually tapering off to an asymptotic response (whose maximum amplitude is proportional to charging current). In contrast, an unhealthy cell that has a reduced level of absorbed electrolyte, due for example to previous episodes of overcharging, shown a pronounced kneel in the curve: the rate of change of the polarization response (its slope) abruptly assumes a lower value.

Two important factors are evident here, shown in FIGS. 9A and 9B. First, when the polarization response begins its precipitous rise, the cell has accepted all the energy it can for recharging so the energy is now going into electrolysis. At this point, it is preferable to discontinue charging, since further energy input is no longer increasing the state-of-charge, but is merely generating gas and unnecessary heat. Second, the knee in the curve is indicative of a relative increase in the electrochemical depolarization process occurring at the negative plate, due to the increase availability of gaseous oxygen which has escaped from the electrolyte and is diffusing directly to the negative plate. Thus, the presence of such a knee is symptomatic of cell dry out, that is, a depletion of electrolyte, as is often caused by excessive overcharge.

What is claimed is:

1. A system for determining the polarization voltages developed in response to an excitation signal applied to a device, the system comprising:

a controlled-current source configured for connection to a first terminal of the device;

a controlled-voltage source configured for connection to a second terminal of the device, wherein the controlled-voltage source is configured to provide self-centering and auto-polarity for the system;

a sensor configured, to sense a voltage across the device and to produce a sensor signal in response to the voltage sensed across the device, and a controller connected to the controlled-current source, the controlled-voltage source, and the sensor, the controller being configured to determine polarization voltages in response to the sensor signal.

2. The system of claim 1, wherein the controller comprises a microprocessor and associated circuitry.

3. The system of claim 1, wherein the controller comprises analog circuitry.

4. The system of claim 1, further comprising Kelvin connection circuitry, the Kelvin connection circuitry comprising:

a first lead connected to the controlled-current source and configured for connection to the first terminal of the device, a second lead connected to the controlled-voltage source and configured for connection to the second terminal of the device, and third and fourth leads connected to the sensor and configured to be connected to, respectively, the first and second terminals of the device.

5. The system of claim 1, wherein the controlled-current source is configured to provide a symmetric, bipolar square wave to the first terminal of the device.

6. The system of claim 1, further comprising a feedback loop between the sensor and the controller, the feedback loop being configured to eliminate a portion of the voltage across the device corresponding to a bias voltage of the device so that the sensor signal reflects only a portion of the voltage across the device.

7. The system of claim 6, wherein the controller is configured to provide self-centering relative to the device by supplying a voltage equal to one half of the DC offset voltage to the controlled-voltage source.

8. A method of determining polarization voltages developed in response to an excitation signal applied to a device, the method comprising:

connecting a controlled-current source to a first terminal of the device;

connecting a controlled-voltage source to a second terminal of the device, wherein the controlled-voltage source is controlled to produce a voltage having a magnitude equal to one half of the non-varying portion of the sensed voltage;

using a controlled-current source to apply a bipolar, symmetric square wave or other waveforms to the device;

sensing a voltage across the device to produce a sensor signal in response to the voltage sensed across the device, and;

modifying the sensor signal to eliminate effects of a bias voltage of the device; and determining polarization voltages in response to the sensor signal.

9. The method of claim 8, further comprising generating a graphical representation of the polarization voltage suitable for immediate visual inspection and analysis.

10. The method of claim 8, further comprising comparing the polarization voltage to baseline data for a class of devices to which the device belongs to assess a relative condition of the device.

* * * * *